(12) United States Patent
Boemler

(10) Patent No.: US 11,063,074 B2
(45) Date of Patent: Jul. 13, 2021

(54) AUTOZERO OF BUFFERED DIRECT INJECTION PIXELS

(71) Applicant: RAYTHEON COMPANY, Waltham, MA (US)

(72) Inventor: Christian M. Boemler, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 89 days.

(21) Appl. No.: 16/592,048

(22) Filed: Oct. 3, 2019

(65) Prior Publication Data

US 2020/0111826 A1 Apr. 9, 2020

Related U.S. Application Data

(60) Provisional application No. 62/741,203, filed on Oct. 4, 2018.

(51) Int. Cl.
*H01L 27/146* (2006.01)
*H03F 3/45* (2006.01)
(Continued)

(52) U.S. Cl.
CPC ......... *H01L 27/14609* (2013.01); *H03F 1/26* (2013.01); *H03F 3/45654* (2013.01);
(Continued)

(58) Field of Classification Search
CPC . H01L 27/14609; H03F 3/45654; H03F 1/26; H04N 5/355; H04N 5/3575; H04N 5/378; H04N 5/3651; H04N 5/3745
See application file for complete search history.

(56) References Cited

U.S. PATENT DOCUMENTS

| 6,384,413 | B1 | 5/2002 | Pain | |
|---|---|---|---|---|
| 2001/0010551 | A1* | 8/2001 | Dierickx | H04N 5/3745 348/241 |
| 2015/0009337 | A1* | 1/2015 | Minlong | H04N 5/357 348/166 |

FOREIGN PATENT DOCUMENTS

CN 1845586 A 10/2016

OTHER PUBLICATIONS

Notification of Transmittal of the International Search Report of the International Searching Authority, or the Declaration; PCT/US2019/054200; dated Dec. 12, 2019, 4 pages.
(Continued)

*Primary Examiner* — Thanh Luu
*Assistant Examiner* — Monica T Taba
(74) *Attorney, Agent, or Firm* — Cantor Colburn LLP

(57) ABSTRACT

A buffered direct injection pixel can be operated such that it is automatically zeroed. The operation includes: during a normal operating mode, controlling a gate voltage of an injection transistor with the output of an amplifier to control a bias of photo-current source, an inverting input of the amplifier being connected to input of the injection transistor through a nulling capacitor; during a nulling operation, closing a first switch to connect the nulling capacitor directly to an output of the amplifier; during the nulling operation, closing a second switch to directly couple the input of the injection transistor to a bias voltage causing the nulling capacitor to store a difference between an output of the amplifier and the bias voltage; and after the nulling operation, providing the voltage stored on the nulling capacitor to the inverting input by opening the first and second switches.

11 Claims, 2 Drawing Sheets

(51) Int. Cl.
*H04N 5/355* (2011.01)
*H04N 5/357* (2011.01)
*H04N 5/378* (2011.01)
*H03F 1/26* (2006.01)

(52) U.S. Cl.
CPC ........... *H04N 5/355* (2013.01); *H04N 5/3575* (2013.01); *H04N 5/378* (2013.01)

(56) References Cited

OTHER PUBLICATIONS

Notification of Transmittal of the Written Opinion of the International Searching Authority, or the Declaration; PCT/US2019/054200; dated Dec. 12, 2019, 8 pages.
International Preliminary Report on Patentability for Application No. PCT/US2019/054200, dated Apr. 15, 2021, 7 pages.

* cited by examiner

AUTOZERO OF BUFFERED DIRECT INJECTION PIXELS

CROSS-REFERENCE TO RELATED APPLICATIONS

This application claims the benefit of U.S. Provisional Application Ser. No. 62/741,203, filed Oct. 4, 2018, which is incorporated herein by reference in its entirety.

BACKGROUND

The present disclosure relates to a digital pixel imager and, in particular, a digital pixel circuit that includes two bloom storage capacitors.

In legacy analog imagers, particularly infrared imagers, photo-current from a detector diode is integrated by a well capacitor coupled to the detector diode, and then once per video frame, the voltage or charge of the well capacitor is transferred to a down-stream analog-to-digital converter (ADC), where the voltage is converted to a binary value. Pixel sizes continue to shrink and the ratio of well capacitor to pixel area shrinks disproportionately more. Simultaneously, there is a demand by consumers for increased Signal-to-Noise Ratio (SNR) which can be realized by increasing effective well capacitance.

In-pixel ADC imagers are used to address this problem associated with decreasing pixel size. In particular, in-pixel ADC imaging improves photo-charge capacity for infrared imaging and other applications as the size of pixels continues to decrease. A good in-pixel ADC design can store nearly all of the available photo-charge from a detector diode and thus improve SNR to near theoretical limits. A common method of integration for in-pixel ADC circuits uses a quantizing analog front end circuit which accumulates charge over a relatively small capacitor, trips a threshold and is then reset. This pattern is repeated as more photo-current integrates.

One type of in-pixel ADC circuit utilizes a direct injection (DI) transistor. In such a circuit charge from a photo-diode is accumulated over an integration capacitor. Charge is accumulated, in general, until a readout time. When that time is reached, the charge stored in integration capacitor is provided to a readout circuit. Such circuits can either integrate then read or read while integrating circuits.

Control of the flow of current from the photo-diode is controlled by an injection transistor. The gate of the injection transistor is coupled to a bias voltage. The level of this voltage can be selected by the skilled artisan and is used, in part, to keep the photo-diode in reverse bias.

Another type of in-pixel circuit utilizes an injection transistor where the bias voltage is controlled by an amplifier that provides negative feedback to the gate voltage of the injection transistor. Such an in-pixel circuit is referred to as a buffered direct injection (BDI) circuit or cell. A BDI pixel is commonly used to prevent de-biasing of the photodiode for high dynamic range scenes containing areas with high flux. That is, the amplifier can keep the reverse bias across the photodiode constant, independent of photocurrent.

SUMMARY

According to one embodiment, a pixel is disclosed. The pixel includes a photo-current source; a readout circuit; and a buffered direct injection integration network. The network includes an input node coupled to the photo current source; an injection transistor coupled the input node; an integration capacitor coupled between the injection transistor and a reference voltage; an amplifier having first and second inputs and an output, the output being coupled to a gate of the injection transistor and to the first input; a nulling capacitor coupled between the input node and the second input; and two nulling switches that includes a first nulling switch coupled between a diode bias voltage and the input node and second nulling switch coupled between the second input and the output. The two nulling switches are open during normal operation and are closed during a nulling period when charge is not be collected on the integration capacitor.

In a pixel according to any prior embodiment, the amplifier is a common source amplifier.

In a pixel according to any prior embodiment, the first input is a positive input and the second input is an inverting input.

In a pixel according to any prior embodiment, the diode bias voltage is a global voltage that is applied to photo-current sources of other pixels.

In a pixel according to any prior embodiment, the network further includes a reset switch coupled in parallel with the integration capacitor.

Any of the above described pixels can be utilized in a system such as a focal plane array. For example, in one embodiment, a focal plane or other array that includes a plurality of pixels as disclosed herein is disclosed.

Also disclosed is a method of operating a buffered direct injection pixel. The method includes: during a normal operating mode, controlling a gate voltage of an injection transistor with the output of an amplifier to control a bias of photo-current source, an inverting input of the amplifier being connected to input of the injection transistor through a nulling capacitor; during a nulling operation, closing a first switch to connect the nulling capacitor directly to an output of the amplifier; during the nulling operation, closing a second switch to directly couple the input of the injection transistor to a bias voltage causing the nulling capacitor to store a difference between an output of the amplifier and the bias voltage; and after the nulling operation, providing the voltage stored on the nulling capacitor to the inverting input by opening the first and second switches.

In a method according to any prior embodiment, the amplifier is a common source amplifier.

In a method according to any prior embodiment, the output is connected to a non-inverting input of the amplifier.

In a method according to any prior embodiment, the bias voltage is a global voltage that is applied to photo-current sources of other pixels.

In a method according to any prior embodiment, the method further includes resetting the integration transistor.

In a method according to any prior embodiment, the nulling operation happens while the integration capacitor is being reset.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

In typical BDI pixels, because an additional amplifier is required, active power consumption and the cell area both increase. In addition, process mismatches and 1/f noise in the amplifier input transistor pair directly translates to biasing errors on the photo-diode.

Ideally, the amplifier and DI transistor will regulate the DI voltage (e.g, the bias voltage) so that it becomes equal to the global DI bias voltage. However due to space constraints the amplifier loop may not have sufficient open loop gain to ensure this happens as the reverse bias voltage of the photodiode changes with photocurrent. This is due to amplification errors in the amplifier. Such errors could be solved by using bigger transistors in the amplifier, but, in space limited situations, this is not a viable solution.

Further, the needed reverse bias varies from pixel to pixel and, as such, non-uniformity in response and dark current can exist across an array of pixels. Further, when switching between colors being sensed, there is no "memory" of last regulation for same color and the BDI loop has to fully settle between the two colors. Also, in order to operate correctly, the amplifier is a differential-input amplifier.

Figure 1:
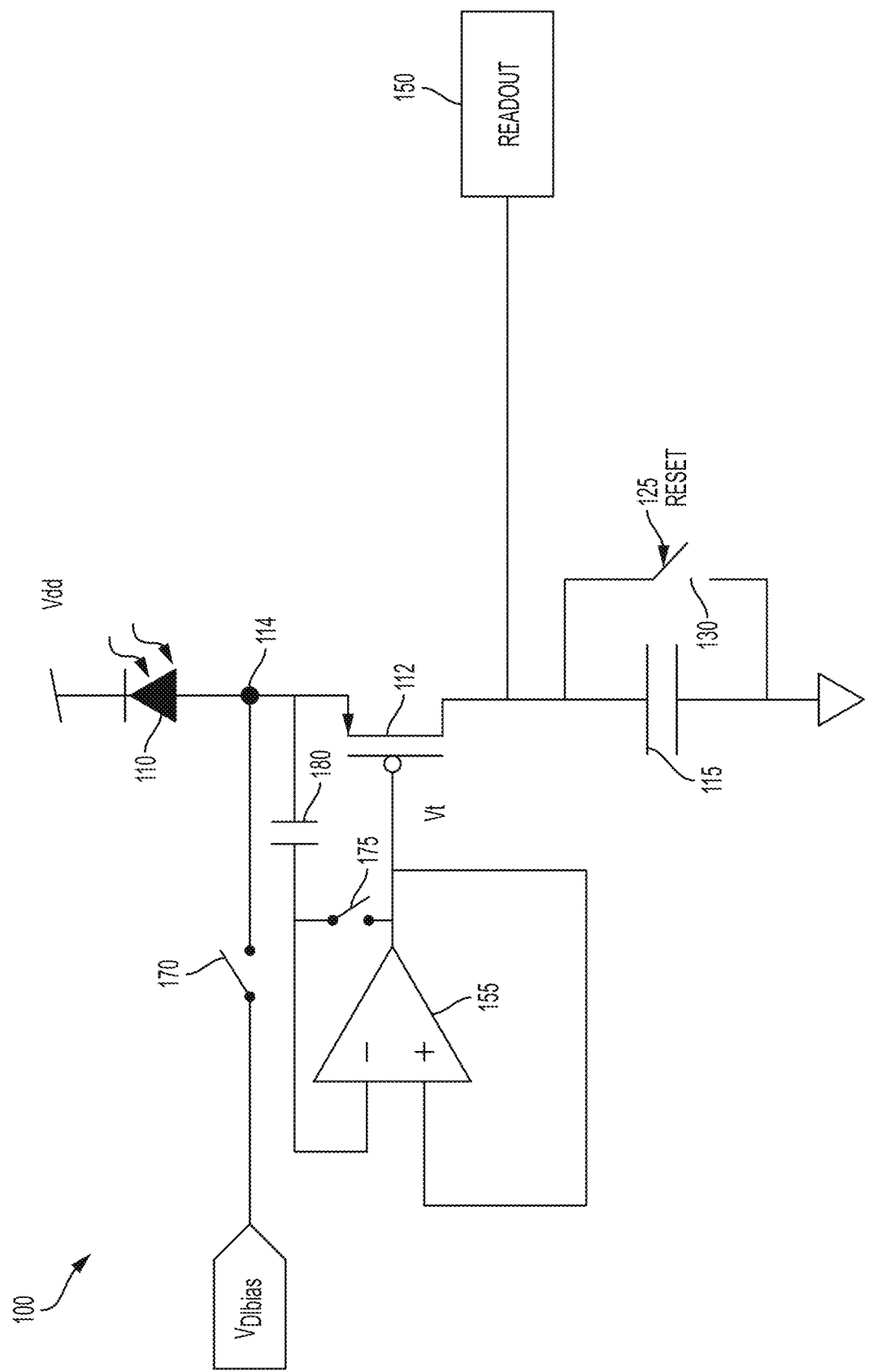
FIG. 1 is a schematic diagram illustrating a BDI cell according to one embodiment during normal operation.

FIG. 1 shows a BDI pixel 100 according to one embodiment and including a photo-diode 110 and a buffered direct injection integration network. The BDI integration network can include an input node 114, an injection transistor 112, an integration capacitor 115, an amplifier 155, a reset switch 130, first and second nulling switches 170 and 175, and a nulling capacitor 180. Charge from the photo-diode 110 is accumulated over the integration capacitor 115. Charge is accumulated, in general, until a readout time. When that time is reached, the charge stored in integration capacitor 115 is provided to a readout circuit generally shown as readout 150. Then, the capacitor 115 can be reset by closing the reset switch 130 upon receipt of a Reset signal 125.

Control of the flow of current from the photo-diode 110 is controlled by the injection transistor 112. The gate of the injection transistor 112 is coupled to an injection transistor bias voltage $V_t$. The level of this voltage can be selected by the skilled artisan and is used, in part, to keep the photo-diode 110 in reverse bias where the voltage at node 114 is lower than the diode supply voltage $V_{dd}$.

In operation, the value of $V_t$ is set by an amplifier 155. The amplifier 155 is a common source amplifier in one embodiment. The positive input of the amplifier 155 can be connected to the output of the amplifier 155 as shown in FIG. 1. Such a common source amplifier is simpler than a differential amplifier used in the prior art.

The inverted gain from the amplifier 155 provides feedback to yield better control over the detector bias (at node 114) at different photocurrent levels. In particular, as the photocurrent increases, the input impedance of the injection transistor 112 is decreased to maintain constant detector bias.

The circuit of FIG. 1 also includes to nulling switches 170 and 175. The negative input of the amplifier 155 is connected to node 114 through the nulling capacitor 180. During normal operation, the nulling switches 170 and 175 are opened as shown in FIG. 1.

Figure 2:
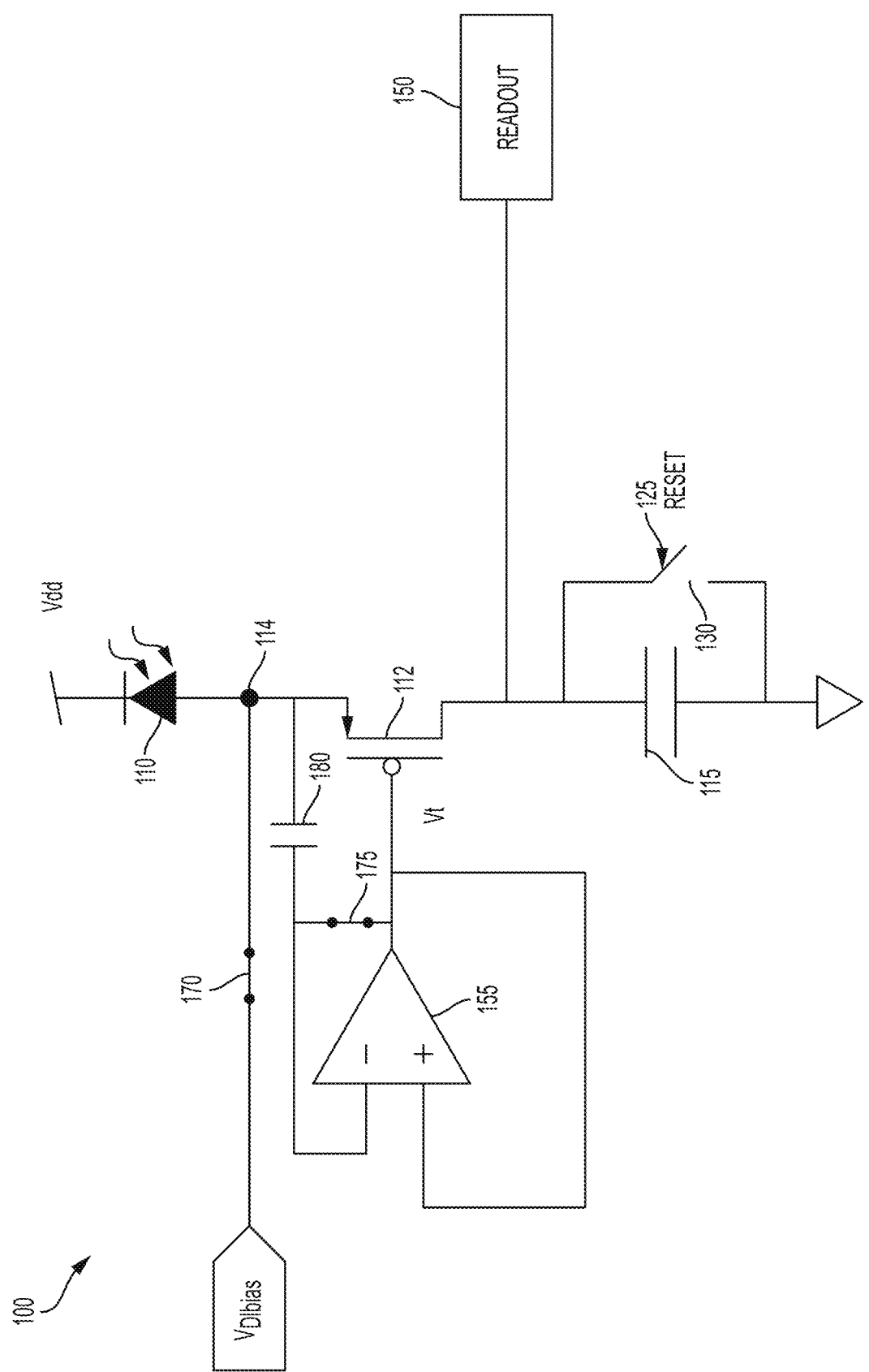
FIG. 2 is a schematic diagram illustrating a BDI cell of FIG. 1 during an auto null phase.

During a non-integration period such as during a pixel reset or the read phase of an integrate-then-read pixel, the circuit 100 can be auto-nulled. This can be accomplished by closing both nulling switches 170 and 175. Such a configuration is shown in FIG. 2.

During auto-null, $V_{DIbias}$ is coupled directly to the photodiode 110 (e.g., at node 114). This causes the voltage at node 114 to equal $V_{DIbias}$ and the output of the amplifier 155 to be $V_{dd}-V_t$. In one embodiment, $V_{DIbias}$ can be provided by a row or column level amplifier.

In more detail, the difference between $V_{DIbias}$ and $V_{dd}$ is the intended target reverse bias for the photodiode 110. Connecting the negative input and the output of the amplifier 155 puts it in unity gain mode with a reference level that would disable the injection transistor 112. As such, the nulling capacitor 180 is then charged with the difference between $V_{DIbias}$ and the output of the amplifier 155 ($V_t$). This level represents the error introduced by the amplifier 155.

During a next integration phase, the switches 170, 175 are again opened. This will cause the nulling capacitor 180 to be placed into the feedback loop of the amplifier 155. This causes the photodiode 110 to be biased with $V_{DIbias}$ without having to apply $V_{DIbias}$ to the photodiode 110.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the present disclosure.

The invention claimed is:

1. A pixel comprising:
   a photo-current source;
   a readout circuit;
   a buffered direct injection integration network comprising:
   an input node coupled to the photo current source;
   an injection transistor coupled the input node;
   an integration capacitor coupled between the injection transistor and a reference voltage;
   an amplifier having first and second inputs and an output, the output being coupled to a gate of the injection transistor and to the first input;
   a nulling capacitor coupled between the input node and the second input; and
   two nulling switches that includes a first nulling switch coupled between a diode bias voltage and the input node and second nulling switch coupled between the second input and the output;
   wherein the two nulling switches are open during normal operation and are closed during a nulling period when charge is not be collected on the integration capacitor.

2. The pixel of claim 1, wherein the amplifier is a common source amplifier.

3. The pixel of claim 2, wherein the first input is a positive input and the second input is an inverting input.

4. The pixel of claim 1, wherein the diode bias voltage is a global voltage that is applied to photo-current sources of other pixels.

5. The pixel of claim 1, further including a reset switch coupled in parallel with the integration capacitor.

6. A method of operating a buffered direct injection pixel, the method comprising:

during a normal operating mode, controlling a gate voltage of an injection transistor with the output of an amplifier to control a bias of photo-current source, an inverting input of the amplifier being connected to input of the injection transistor through a nulling capacitor;

during a nulling operation, closing a first switch to connect the nulling capacitor directly to an output of the amplifier;

during the nulling operation, closing a second switch to directly couple the input of the injection transistor to a bias voltage causing the nulling capacitor to store a difference between an output of the amplifier and the bias voltage; and after the nulling operation, providing the voltage stored on the nulling capacitor to the inverting input by opening the first and second switches.

7. The method of claim 6, wherein the amplifier is a common source amplifier.

8. The method of claim 6, wherein the output is connected to a non-inverting input of the amplifier.

9. The method of claim 6, wherein the bias voltage is a global voltage that is applied to photo-current sources of other pixels.

10. The method of claim 6, further comprising:

resetting the integration transistor.

11. The method of claim 10, wherein the nulling operation happens while the integration capacitor is being reset.

* * * * *